US010101766B2

(12) United States Patent
Lin et al.

(10) Patent No.: US 10,101,766 B2
(45) Date of Patent: Oct. 16, 2018

(54) HANDLE MODULE

(75) Inventors: Yi-Feng Lin, Taipei (TW); Barry T. Phillips, Fort Collins, CO (US); David Quijano, Fort Collins, CO (US); Gregory A. Standiford, Loveland, CO (US); Josh K. Peterson, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 725 days.

(21) Appl. No.: 13/819,581

(22) PCT Filed: Oct. 22, 2010

(86) PCT No.: PCT/US2010/053838
§ 371 (c)(1),
(2), (4) Date: Feb. 27, 2013

(87) PCT Pub. No.: WO2012/054061
PCT Pub. Date: Apr. 26, 2012

(65) Prior Publication Data
US 2013/0154288 A1    Jun. 20, 2013

(51) Int. Cl.
*G06F 1/16* (2006.01)
*G06F 1/18* (2006.01)
*H05K 5/02* (2006.01)

(52) U.S. Cl.
CPC ............... *G06F 1/16* (2013.01); *G06F 1/181* (2013.01); *H05K 5/023* (2013.01)

(58) Field of Classification Search
CPC .. H05K 7/00; H05K 7/14; H05K 5/02; H05K 5/023; G06F 1/16; G06F 1/181; G06F 1/187; G06F 1/184; G11B 33/128; G11B 33/022

USPC ....... 361/685, 686, 724, 725, 727, 754, 756; 249/15
See application file for complete search history.

(56) References Cited

U.S. PATENT DOCUMENTS

| 5,233,594 | A | * | 8/1993 | Wilhelm | ............. G11B 33/124 |
|  |  |  |  |  | 360/98.01 |
| D364,148 | S | * | 11/1995 | Jasinski | ....................... D14/349 |
| 5,485,348 | A |  | 1/1996 | Oros |  |
| 5,557,499 | A | * | 9/1996 | Reiter et al. | ............. 361/679.39 |
| 6,049,452 | A | * | 4/2000 | You et al. | ............... 361/679.37 |
| 6,115,883 | A |  | 9/2000 | Um |  |

(Continued)

FOREIGN PATENT DOCUMENTS

| CN | 1117605 | 2/1996 |
| CN | 2412240 | 12/2000 |

(Continued)

OTHER PUBLICATIONS

International Search Report dated Jul. 28, 2011 International Application No. PCT/US2010/053838 Filing Date Oct. 22, 2010.

*Primary Examiner* — Dimary Lopez Cruz
*Assistant Examiner* — Abhishek Rathod
(74) *Attorney, Agent, or Firm* — Trop, Pruner & Hu PC

(57) ABSTRACT

A handle module has a housing conforming to a disk drive form factor. The handle module has mounting features configured to securely install the housing in a slot conforming to the disk drive form factor. The handle module has a finger-friendly recess extending from a front of the handle module and into an interior of the housing.

17 Claims, 4 Drawing Sheets

(56) References Cited

U.S. PATENT DOCUMENTS

| | | | |
|---|---|---|---|
| 6,220,680 B1* | 4/2001 | Chen | G06F 1/181 |
| | | | 312/223.2 |
| 6,774,808 B1* | 8/2004 | Hibbs | G06F 1/184 |
| | | | 340/686.4 |
| 6,932,447 B2* | 8/2005 | Chen | A47B 88/06 |
| | | | 312/223.2 |
| 7,570,484 B1* | 8/2009 | Sivertsen | 361/679.37 |
| D615,974 S * | 5/2010 | Quijano | D14/354 |
| 2002/0121004 A1 | 9/2002 | Feldmeyer | |
| 2003/0122457 A1* | 7/2003 | Diaz | G06F 1/181 |
| | | | 312/223.2 |
| 2005/0128694 A1* | 6/2005 | Han | G06F 1/182 |
| | | | 361/679.01 |
| 2005/0157464 A1 | 7/2005 | McAlister | |
| 2005/0219510 A1* | 10/2005 | Smith | H04L 12/64 |
| | | | 356/73 |
| 2005/0270737 A1* | 12/2005 | Wilson | G06F 1/184 |
| | | | 361/679.37 |
| 2006/0050477 A1 | 3/2006 | Wu et al. | |
| 2007/0230105 A1* | 10/2007 | Su | G06F 1/187 |
| | | | 361/679.33 |
| 2008/0266779 A1 | 10/2008 | Thomas et al. | |

FOREIGN PATENT DOCUMENTS

| | | |
|---|---|---|
| CN | 2670998 | 1/2005 |
| CN | 2699352 | 5/2005 |
| CN | 2919354 | 7/2007 |
| CN | 201017261 | 2/2008 |
| CN | 201037917 | 3/2008 |
| CN | 201066477 | 5/2008 |
| CN | 201107704 | 8/2008 |
| CN | 101269741 | 9/2008 |
| CN | 201130337 | 10/2008 |
| KR | 20080002903 | 1/2008 |

* cited by examiner

HANDLE MODULE

CROSS-REFERENCE TO RELATED APPLICATION

This application is a national stage application under 35 U.S.C. § 371 of PCT/US2010/053838, filed Oct. 22, 2010.

BACKGROUND

While computers employing a desktop tower form factor are not considered "portable", they are moved at times. In some scenarios, the location of the tower computer is changed, e.g., either because the user is changing locations, or because the tower computer is being repurposed for use by a different user. In other scenarios, a computer's position is adjusted, e.g., to gain access to a rear connectivity panel. For such scenarios, one or two protruding or recessed handles may be built into or attached to a tower computer.

DETAILED DESCRIPTION

Figure 1:
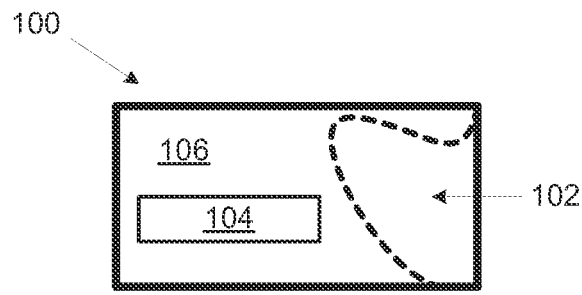
FIG. 1 is a schematic diagram of a handle module in accordance with an embodiment.
Figure 2:
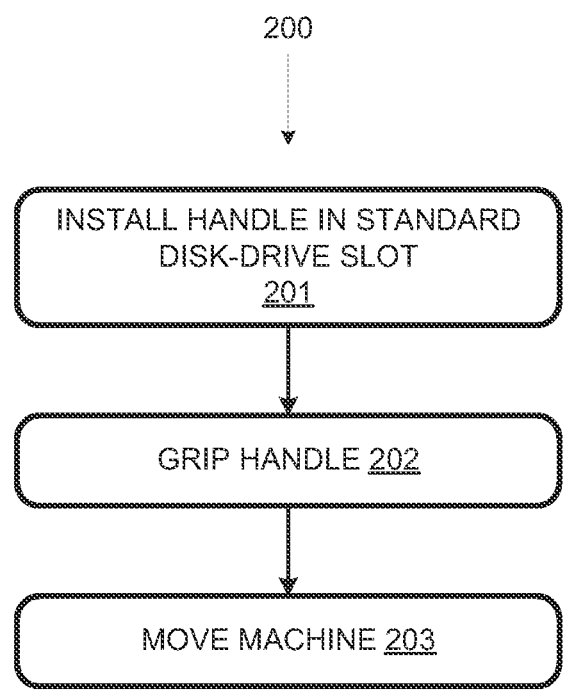
FIG. 2 is a flow chart of a handle-module process in accordance with an embodiment.

A modular recessed handle 100 has a forward-facing recess 102 in and installation features 104 on a housing 106 conforming to the form factor of a standard disk drive, as shown in FIG. 1. In a process 200, flow-charted in FIG. 2, the handle module can be installed 201 in a slot designed to accommodate a standard form-factor disk drive. Once installed, a human hand can grip 202 the handle and then move 203 a computer in which the handle is installed.

In one embodiment, the handle is installed in a top 5.25" (13.3 cm) optical drive bay of a tower computer. Herein, an "optical drive" bay is externally accessible so that an optical disk can be inserted and removed. In contrast, some hard disk bays are internal and not externally accessible. However, an optical drive bay may accommodate a hard disk, an optical disk drive, a card reader, an I/O interface, as known in the art, or a handle, as described herein. In other embodiments, other form factors apply; for example, in one embodiment the handle is designed to conform to a 3.5" (8.9 cm) floppy-drive form factor. The handle can be used in a tower computer or a computer of another form factor, e.g., a rack mount computer.

Since the handle is modular, a builder can decide to include the handle or omit it from a particular machine to accommodate a user's preference. Also, a user can install an after-market version of such a handle. In some embodiments, additional functionality can be provided for a drive slot bearing a handle. In an embodiment, the handle accommodates an internal hard drive. In another embodiment, a card reader slot is built into the handle. Thus, the handle design provides maneuverability while still providing additional functionality for a disk drive slot.

Figure 3:
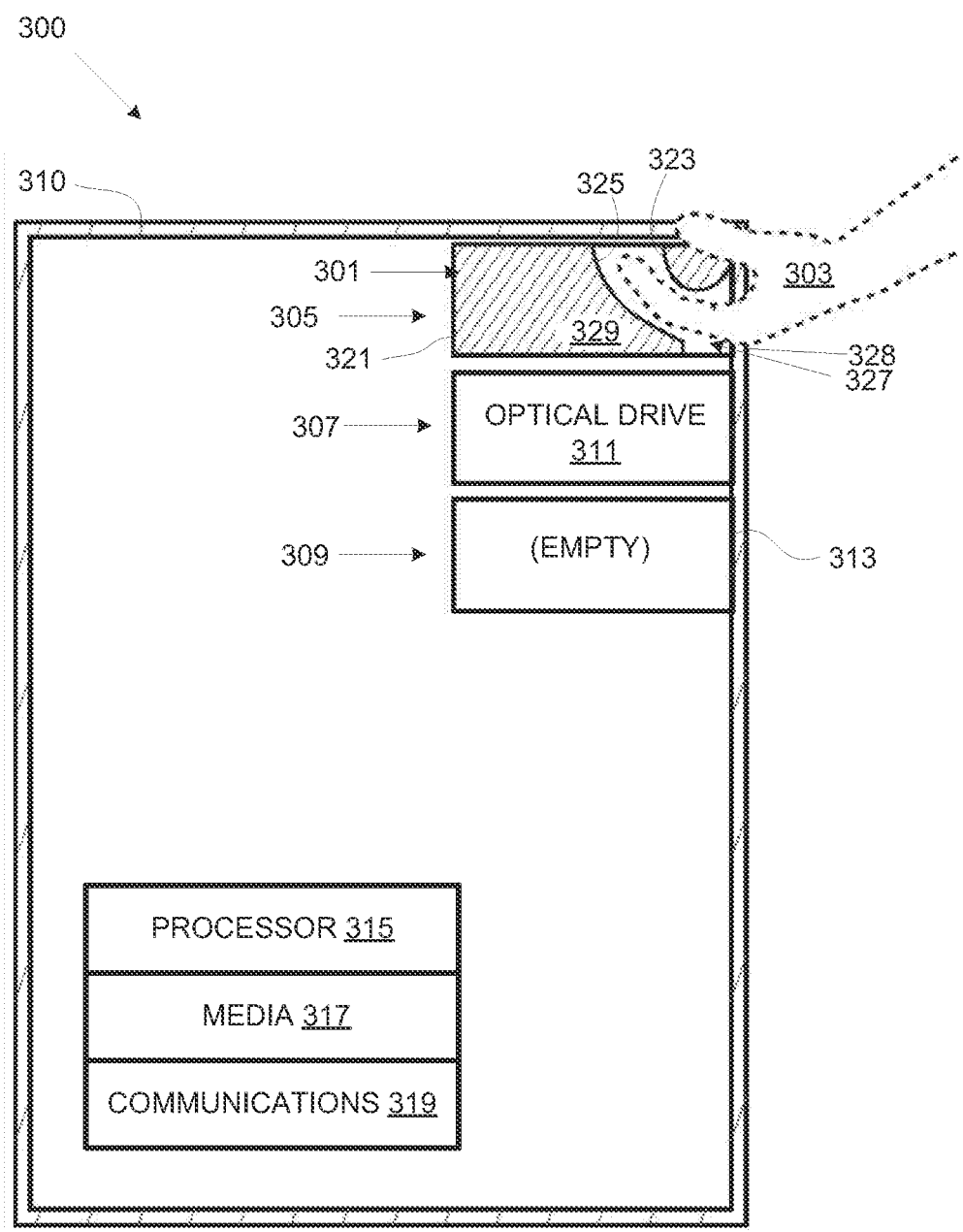
FIG. 3 is a schematic diagram of a computer system including a handle module in accordance with an embodiment.
Figure 4:
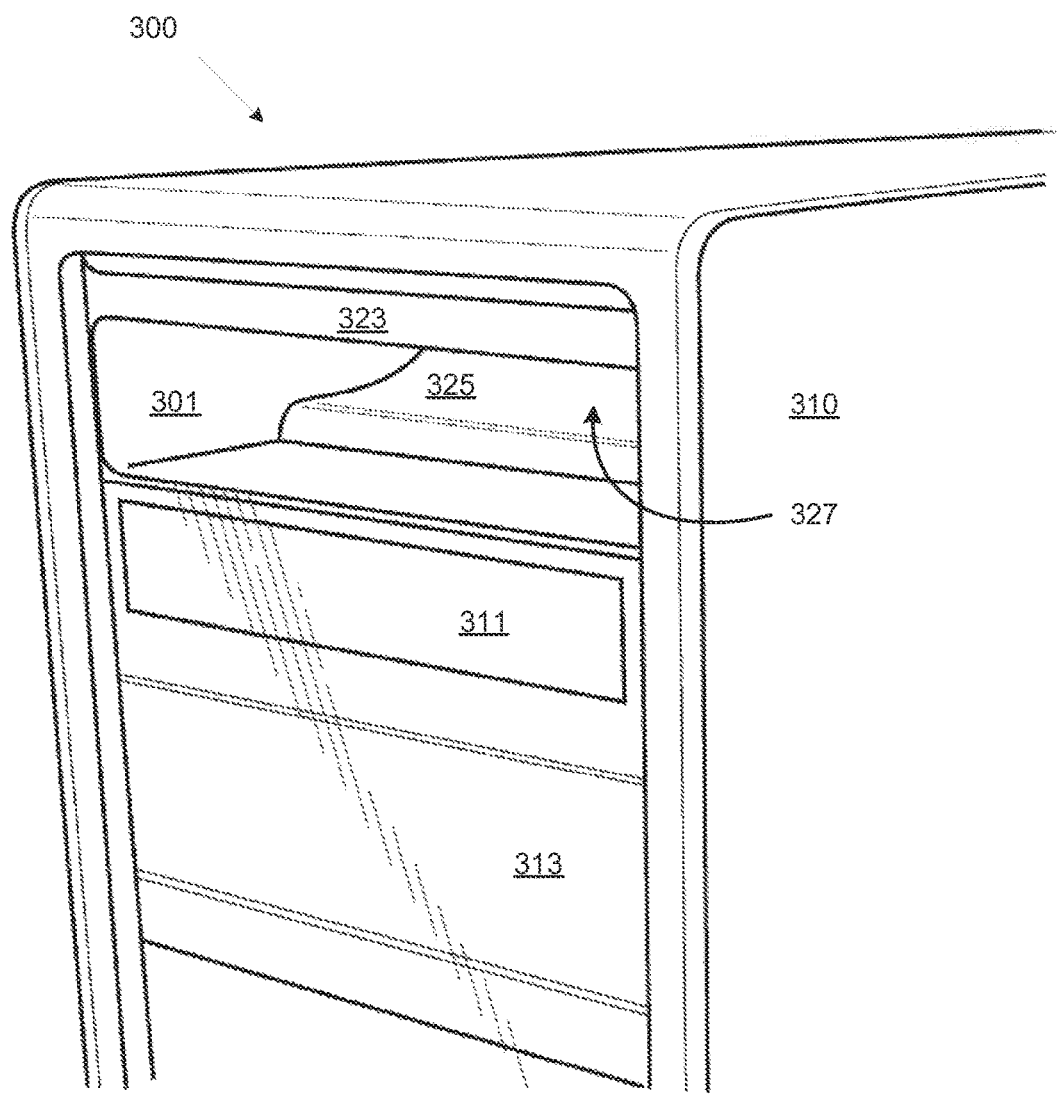
FIG. 4 is a perspective drawing of a portion of the computer system of FIG. 3.

A computer system 300 includes a fixed handle module 301, as shown in FIGS. 3 and 4. Handle module 301 can be gripped by a hand 303, as indicated in FIG. 3. Computer system 300 includes three vertically arranged optical disk drive (ODD) slots 305, 307, and 309 in a case 310. Handle module 301 is installed longitudinally into the top ODD slot 305. An optical disk drive 311 is mounted in the middle slot 307. Bottom slot 309 is empty except for a front cover 313. Computer system 300 also includes a processor 315, media (including solid-state memory) 317, and communications devices 319 (including network and input/output devices) as represented in block form in FIG. 3.

Handle module 301 includes a housing 321, a ridge 323, and a back-wall 325. Ridge 323 is spaced from back wall 325 to define a finger-friendly recess 327 extending from a front 328 of the handle module and into an interior 329 of said housing. Recess 327 provides an ergonomic grip that can be used to carry computer 300 or pull it forward, etc. As evident in FIG. 4, handle 301 is nom protruding in the sense that it does not protrude outside the smallest rectangular parallelepiped envelope (not shown) that can contain case 310.

Handle module 301 can be used in contexts other than tower computer 300. For example, the computer may have one or more ODD slots. The computer can have a horizontal or a vertical (tower) form factor. The computer can be designed as a stand-alone machine or to be part of a rack or other modular computer system. In the context of a rack system, handle 301 can facilitate removal of rack mount computers (with handle modules installed) from a rack.

Figure 5:
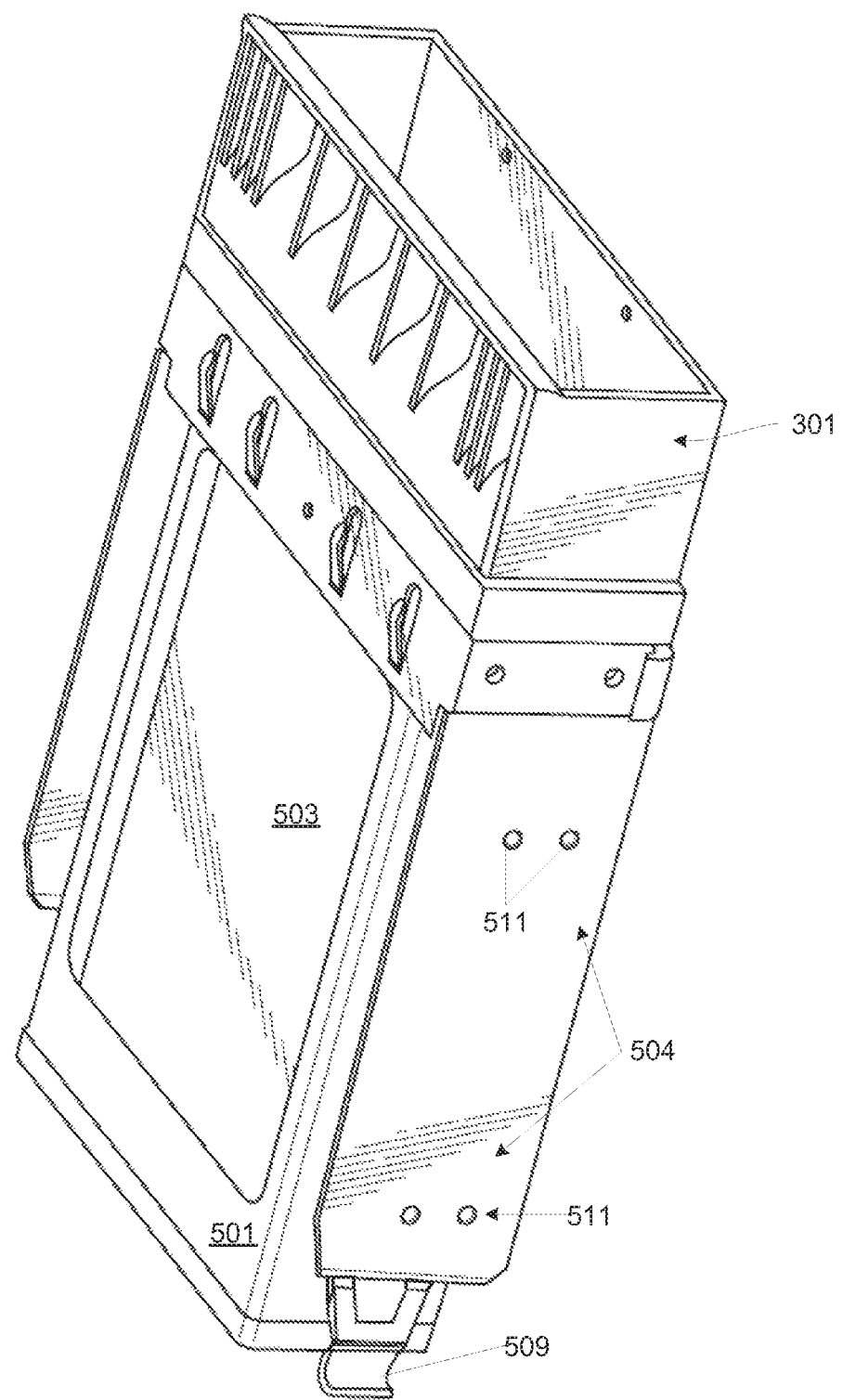
FIG. 5 is a perspective drawing of the handle module of FIG. 3 with a hard drive installed therein.

Handle module 301 is shown in FIG. 5 with a hard disk mounting frame 501 installed and a hard disk 503 installed in frame 501. Frame 501 and hard disk 503 conform to a standard 3.5" hard drive form factor and readily fit in slot 305 (FIG. 3) along with handle module 301. In an alternative embodiment the frame and hard disk conform to a standard 2.5" (6.4 cm) hard drive form factor. Handle module 301 includes an installation feature set 504, including standard mounting holes 511, to secure handle 301 in slot 305. Handle module 301 also includes clips 509 (one of two shown) for securing hard disk 503 in frame 501 once it is inserted into place. In alternative embodiments, additional or different mechanisms are used for securing a handle module in a disk-drive slot.

FIG. 5 depicts just one of many possible examples of ways functions can be combined with a handle module to provide additional functionality for the incorporating slot. Other examples include: 1) incorporating a media, e.g., PC Card, reader in the ridge of the handle module; 2) including functional or accent lighting into the ridge of the handle module, 3) incorporating a fingerprint reader in the ridge or on one side of the handle module; and 4) including a storage slot for holding USB keys, etc. Regarding the last two examples, the recess may or may not extend the full horizontal width of the handle module; in the latter case, room may be left for an additional storage compartment or other functional elements.

Herein, a "module" is a device or assembly that can be installed and removed intact from a host system. Thus, for example, optical disk drives, floppy disk drives, hard disks, and other devices are provided in the form of modules that can be inserted and removed using slots in a computer system. Herein, a "handle" is a device or structure that can be gripped by a human so that a system incorporating the handle can be carried or moved at least in part by applying force via the handle. Herein, a "housing" is a structure that encloses an interior, possibly including interior components.

Herein, a "form factor" is a set of specifications. A disk-drive form factor is a form factor that applies to disk drives, both to the disk drives and to slots into which a conforming disk drive can be mounted. A 5.25" form factor has been prevalent for many years in the computer industry for hard disks and optical disk drives. This form factor is still used for optical drives. Hard disks are increasingly conforming to smaller form factors, e.g., 3.5" form factors and 2.5" form factors, but can accommodate larger form factor slots through mounting frames and kits. Note there is more than one 5.25" form factor, as there are at least full-height and half-height specifications. Herein, "installation features" refers to clips, screws, screw holes, and the like used for securely installing a module into position, e.g., in a slot.

Herein, a "recess" is surface and an interior volume partially enclosed by the recess, wherein the interior volume is included in the interior of a rectangular parallelepiped envelop for an object, e.g., a handle module or a computer system. Herein, "finger-friendly" means ergonomically suited for use by human fingers; it practice. The fingers being of a normal sized hand for a normal male or female adult human. Thus, a finger-friendly recess allows fingers to extend far enough in that a grip can be formed suitable for carrying or sliding the host machine. "Gripping" herein refers to holding a handle feature (e.g., the ridge) so that the host computer can be moved without the hand being retracted from the recess; more specifically, as used herein, "gripping" involves inserting at least three finger tips and at least one knuckle into the recess. An installation feature set is a set of one or more features that can be used to secure a module being installed.

Herein, "fixed" means components of the handle module do not move relative to each other once installed. Herein, as indicated above, "non-protruding" means that it does not extend through the boundary of the smallest rectangular parallelepiped on the host machine. In the case of a hinged handle, it is non-protruding only if it is non-protruding in every allowed rotational position about the hinge. Hinged handles are not "fixed".

Herein, "longitudinal", "horizontal" and "vertical" are substantially orthogonal directions. "Longitudinal" refers to a dimension along which modules are inserted and removed into and from a computer slot. "Front" refers to a plane through which devices are inserted into and removed from a slot. "Horizontal" and "vertical" refer to dimensions orthogonal to the longitudinal dimension and relative to a computer system in its normal orientation.

Herein, a "system" is a set of interacting elements, wherein the elements can be, by way of example and not of limitation, mechanical components, electrical elements, atoms, physical analogs of computer-executable instructions, and process segments. In this specification, related art is discussed for expository purposes. Related art labeled "prior art", if any, is admitted prior art. Related art not labeled. "prior art" is not admitted prior art. The illustrated and other described embodiments, as well as modifications thereto and variations thereupon are within the scope of the following claims.

What is claimed is:

1. A handle module comprising:
   a housing conforming to a disk drive form factor;
   an installation feature set configured to securely install the housing in a drive slot of a computer, the drive slot conforming to the disk drive form factor;
   a handle recess extending from a front of the handle module and into an interior of the housing; and
   a ridge disposed within the interior of the housing, wherein the ridge is sized and shaped to allow a human hand to carry the entire computer,
   wherein the handle module is to be securely installed in the drive slot using one or more screws.

2. A handle module as recited in claim 1 wherein the handle module is sized and shaped to be installed in the drive slot without including a disk drive in the drive slot.

3. A handle module as recited in claim 1 wherein the ridge forms a curved surface within the handle recess.

4. A handle module as recited in claim 1, wherein the handle recess is fixed and does not move relative to the handle module.

5. A handle module as recited in claim 1, wherein the handle module is to support a weight of the entire computer.

6. A handle module as recited in claim 1 wherein the installation feature set comprises one or more screw holes on the housing to receive the one or more screws.

7. A handle module as recited in claim 1, wherein the installation feature set comprises at least one clip to keep the handle module fixed in the drive slot while the entire computer is carried using the handle module.

8. A process comprising:
   installing a non-protruding handle module into a slot of a computer using one or more screws, the slot conforming to a standard disk drive form factor, the handle module comprising a recess with an internal ridge, the one or more screws to retain the handle module in the slot while the computer is carried via the handle module;
   gripping the internal ridge of the handle module; and
   carrying the entire computer at least in part by applying force to the internal ridge of the handle module.

9. A process as recited in claim 8 wherein the internal ridge forms a curved surface within the recess of the handle module.

10. A process as recited in claim 8 wherein the recess is fixed and does not move relative to the handle module.

11. A process as recited in claim 8 wherein the handle module supports a full weight of the computer.

12. A process as recited in claim 8 wherein installing the handle module into the slot comprises using one or more clips to retain the handle module in the slot while the computer is carried via the handle module.

13. A process as recited in claim 8 wherein no hard drive is located in the slot including the handle module.

14. A computing device, comprising:
   a case;
   a plurality of drive slots; and
   a handle module installed in a first drive slot of the plurality of drive slot using one or more screws, the handle module comprising a recess extending into an interior of the handle module, wherein the recess defines a ridge and is sized to receive a plurality of fingers, the handle module to be gripped by a human hand to lift the entire computer, the one or more screws to retain the handle module in the slot while the computer is carried via the handle module.

15. The computing device of claim 14, wherein the ridge forms a curved surface within the recess of the handle module.

16. The computing device of claim 14, wherein the recess is fixed and does not move relative to the handle module.

17. The computing device of claim 14, wherein the handle module is installed in the slot using a clip.

* * * * *